United States Patent
Heid

(10) Patent No.: US 6,265,872 B1
(45) Date of Patent: Jul. 24, 2001

(54) DIFFUSION DETECTION BY MEANS OF MAGNETIC RESONANCE

(75) Inventor: Oliver Heid, Gunzenhausen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/135,165

(22) Filed: Aug. 18, 1998

(30) Foreign Application Priority Data

Aug. 19, 1997 (DE) .................................. 197 35 684

(51) Int. Cl.⁷ .................. G01V 3/00; G01R 33/20
(52) U.S. Cl. ............................................ 324/307
(58) Field of Search ........................ 324/307, 306, 324/309, 303, 300

(56) References Cited

U.S. PATENT DOCUMENTS

| | | | |
|---|---|---|---|
| 4,595,879 | 6/1986 | Lent et al. | 324/309 |
| 4,780,674 | 10/1988 | Breton et al. | 324/309 |
| 4,889,127 | 12/1989 | Takeda et al. | 324/306 |
| 4,954,779 | 9/1990 | Zur | 324/306 |
| 5,539,310 | 7/1996 | Basser et al. | 324/307 |
| 5,671,741 | 9/1997 | Lang et al. | 324/307 |

FOREIGN PATENT DOCUMENTS

| | | |
|---|---|---|
| 0 595 391 A1 | 4/1994 | (EP) . |
| WO 95/18386 | 6/1995 | (WO) . |

OTHER PUBLICATIONS

"Spin Diffusion Measurements: Spin Echoes in the Presence of a Time–Dependent Field Gradient, " Stejskal et al, J. of Chem. Physics, vol. 42, No. 1, Jan. 1, 1995, pp. 288–292.

"Microcirculation and Diffusion Studies in Humans Using FT Velocity Distribution, Line Scans and Echo Planar Imaging," Feinberg et al, SMR Workshop on Future Directions in MRI, Jun. 7–8, Bethesda, Maryland, pp.1610–164.

*Primary Examiner*—Jay Patidar
*Assistant Examiner*—Dixomara Vargas
(74) *Attorney, Agent, or Firm*—Schiff Hardin & Waite

(57) ABSTRACT

Diffusion detection by means of magnetic resonance is accomplished by obtaining a spin echo signal in a readout window by exciting a nuclear resonance signal with a first radio-frequency pulse and by refocusing by at least two other radio-frequency pulses; and activating diffusion gradient pulses of alternating polarity in at least one direction prior to the readout window. The gradient time integrals of the diffusion gradient pulses are different from each other.

3 Claims, 4 Drawing Sheets

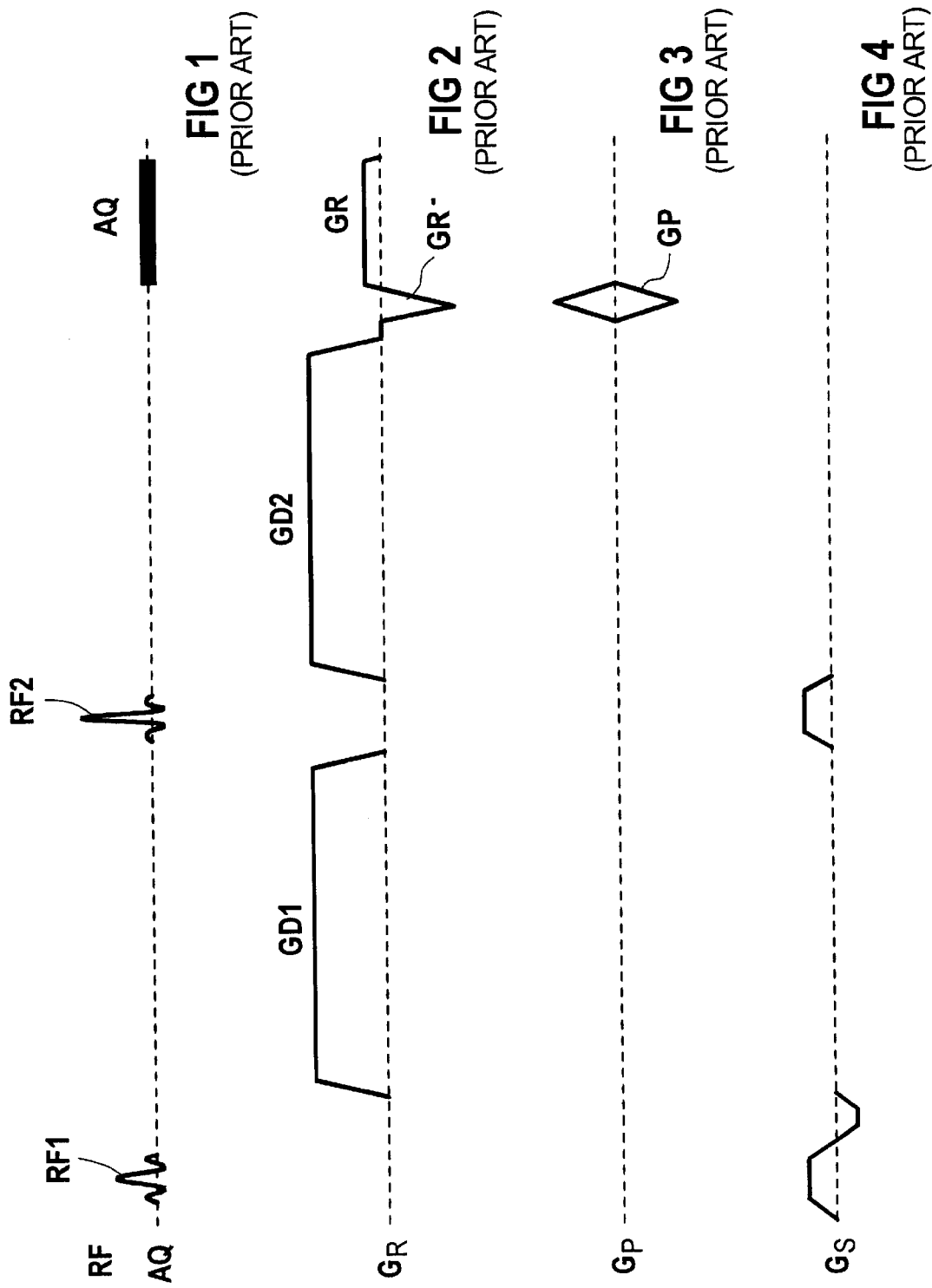

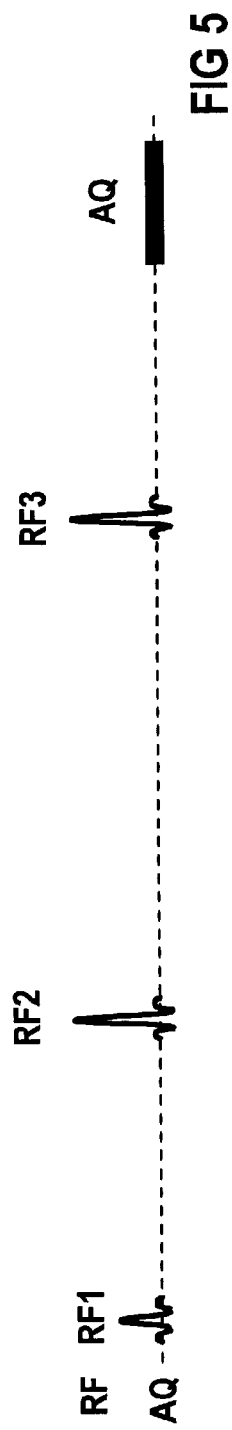
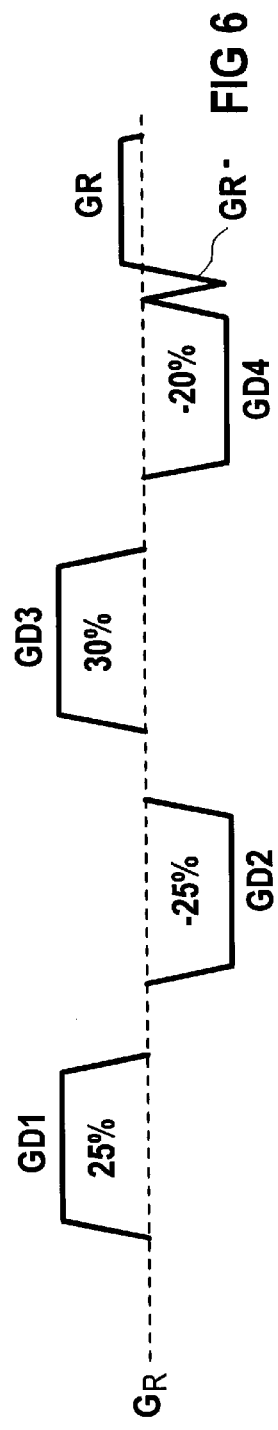
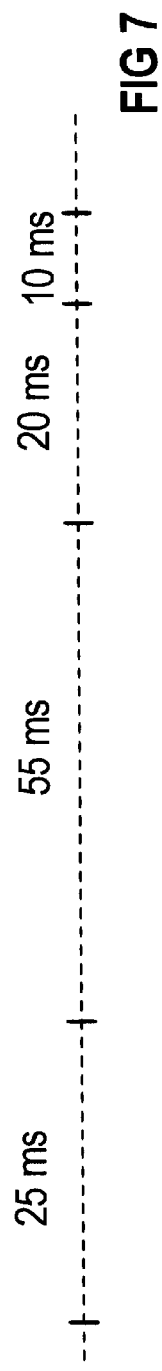
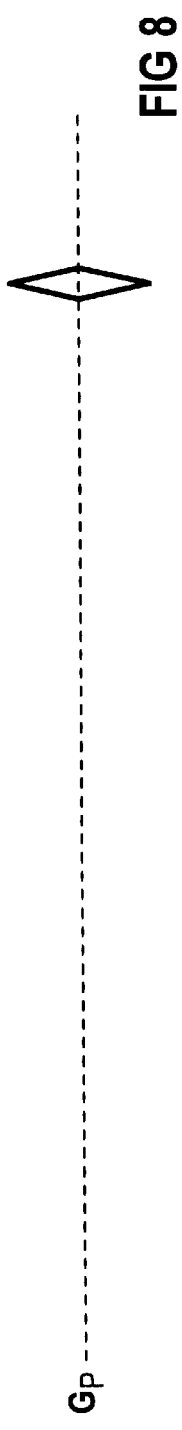

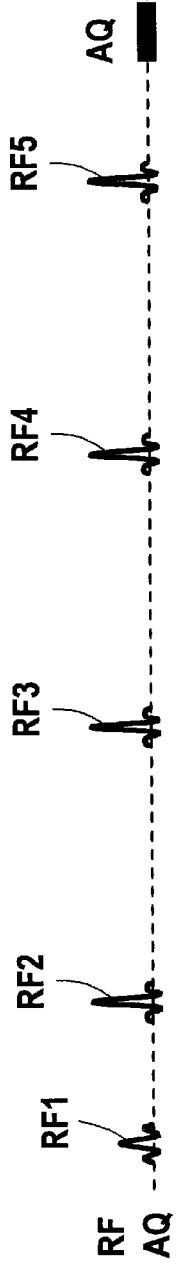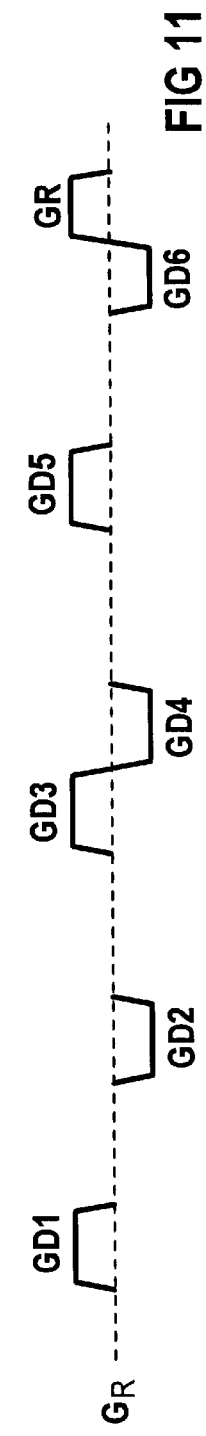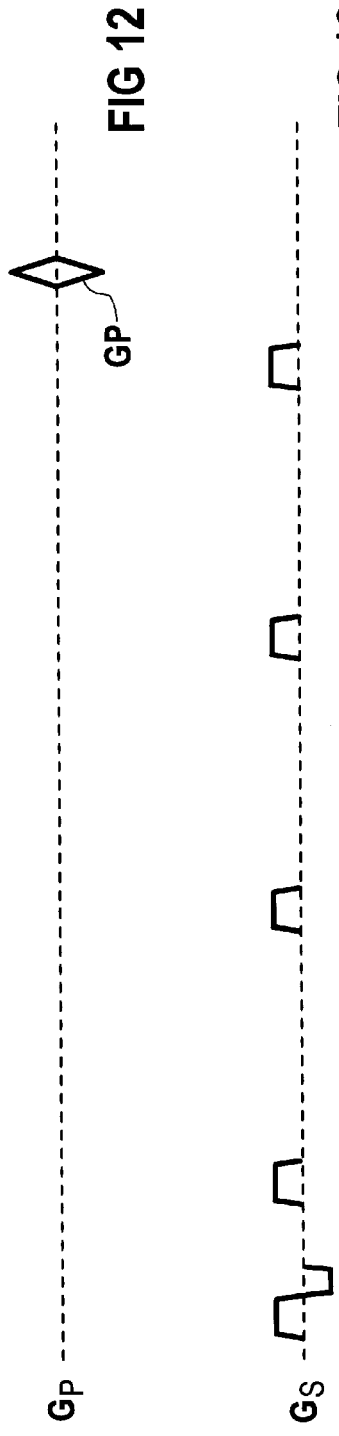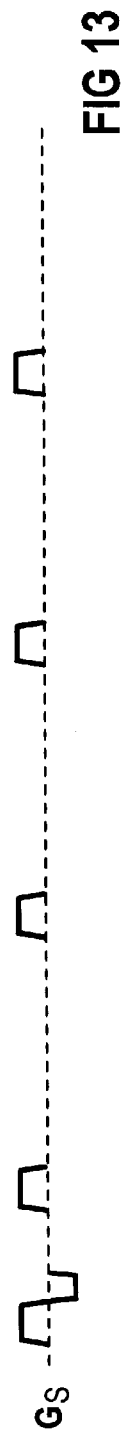

DIFFUSION DETECTION BY MEANS OF MAGNETIC RESONANCE

BACKGROUND OF THE INVENTION

1. Field of the Invention

The present invention relates to a method for diffusion detection by means of magnetic resonance (MR).

2. Description of the Prior Art

It was suggested by Stejskal/Tanner in The Journal of Chemical Physics, Vol. 42, Nr. 1, 288–292, 1. Jan. 1965 to execute a diffusion measurement with a spin echo method gradient pulses of the same polarity produced before and after a 180° radio-frequency pulse. In the following, such gradient pulses, which make a nuclear resonance signal sensitive to diffusion, are termed "diffusion gradients" for short. In the original suggestion a spatial resolution was still not carried out in the MR experiment. The method according to Stejskal/Tanner was later applied in connection with imaging MR as well; i.e. in addition to the diffusion gradients according to Stejskal/Tanner, gradients for spatial encoding of the obtained nuclear resonance signal were also generated. In the pulse sequences known hitherto the application of diffusion gradients frequently leads to problems with the imaging, however. For example, in the echo-planar method (EPI) distortions appear on the order of magnitude of 10% of the image size. The effect of fat saturation is extremely compromised.

From the article "Microcirculation and diffusion studies in humans using FT velocity distribution, line scans and echo planar imaging" by D. Feinberg and P. Jakob in SMR Workshop on Future Directions in MRI, 7–8 June 1990, Bethesda, MD, a pulse sequence for diffusion measurement is known wherein two 180° refocusing pulses follow a 90° exciting pulse. In an exemplary embodiment a first gradient pulse is actuated between the 90°exciting pulse and the first 180° refocusing pulse, a bipolar gradient pulse is actuated between the two 180° refocusing pulses, and another gradient pulse is actuated between the second 180° refocusing pulse and the readout time window. The gradient pulses are dimensioned such that they produce a sensitivity to diffusion. Considered over all of the gradient pulses, the gradient time integral is zero, so that stationary spins are not dephased.

Such pulse sequences exhibit the problem that due to the 180° refocusing pulses stimulated echos are generated which interfere or superimpose with other echos, thus leading to image artefacts.

SUMMARY OF THE INVENTION

An object of the present invention is to provide an MR pulse sequence with diffusion detection wherein disturbances in the image are avoided.

Because of this difference of the gradient time integral, the rephasing condition for stimulated echos is no longer satisfied in the readout window, so that these echoes do not contribute to the MR signal in a disturbing manner.

DESCRIPTION OF THE DRAWINGS

FIGS. 1–4 illustrate a pulse sequence with a conventional diffusion gradient according to Stejskal/Tanner, for describing the problem to which the inventive solution is directed.

FIGS. 5–9 illustrate a first exemplary embodiment of a pulse sequence with the inventive bipolar diffusion gradient.

FIGS. 10–13 illustrate a second exemplary embodiment of a pulse sequence with the inventive bipolar diffusion gradient.

DESCRIPTION OF THE PREFERRED EMBODIMENTS

Figure 14:
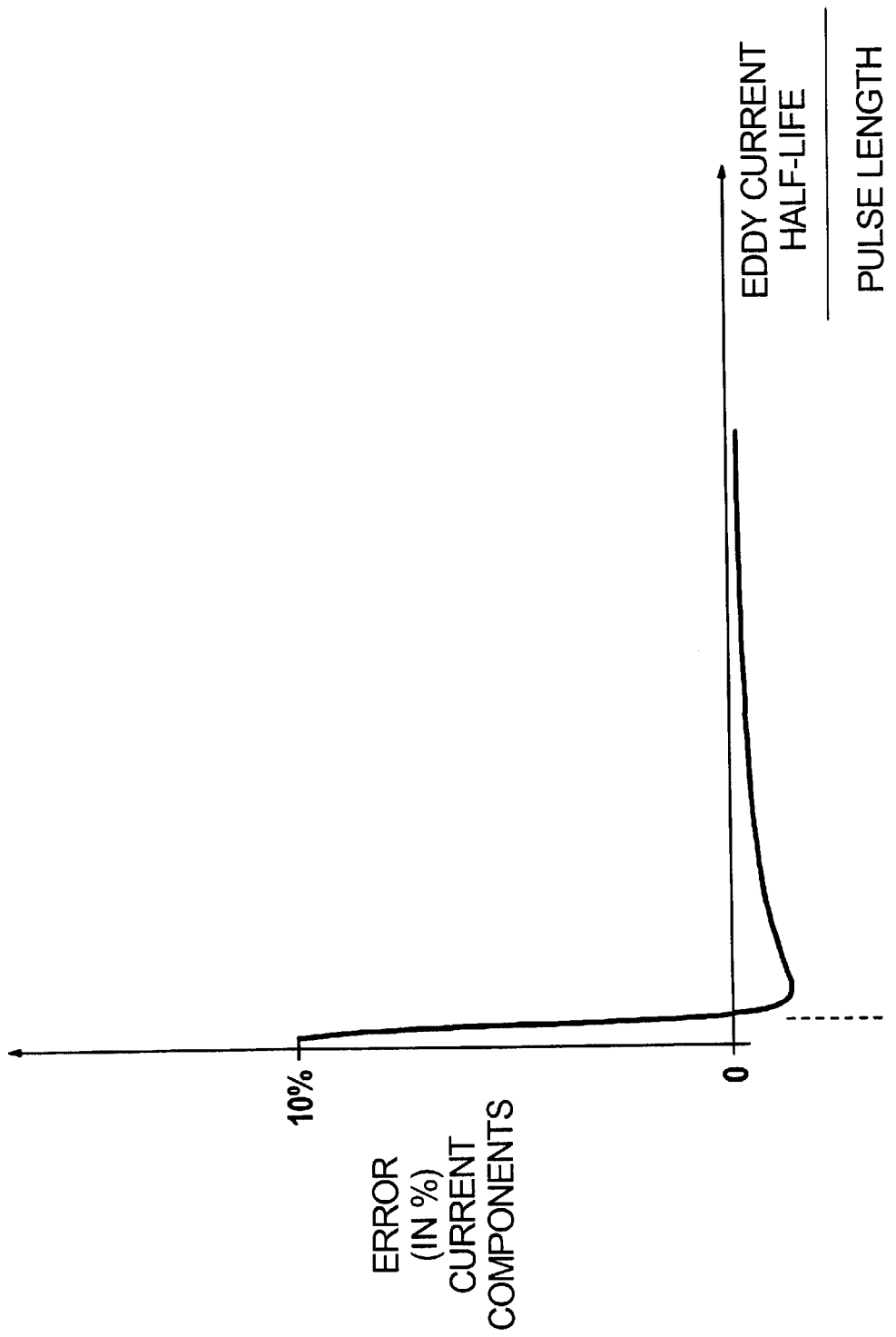
FIG. 14 shows the error curve of the eddy current components which arises with the pulse sequence of FIGS. 5–9.

In the conventional diffusion experiment according to the FIGS. 1–4 a 90° radio-frequency pulse RF1 (FIG. 1) is initially emitted in under the influence of a slice selection gradient GS (FIG. 4). Nuclear spins are thus excited in a slice of the examination subject in known fashion. A first positive sub-pulse GD1 of the diffusion gradient GD then follows, which is in the direction of the readout gradient GR in the example shown in FIG. 2. The dephasing effected by the positive sub-pulse GD1 is subsequently cancelled by a negative sub-pulse of the slice selection gradient GS. A 180° radio-frequency pulse RF2 follows in the next time interval, which refocuses the nuclear spins excited with the first radio-frequency pulse RF1, leading to a spin echo in an acquisition window AQ. Prior to the acquisition window AQ a second sub-pulse GD2 of the diffusion gradient GD is actuated, this having the same polarity as the first sub-pulse GD1. A phase encoding gradient GP is further actuated prior to the acquisition window AQ for spatial resolution in a phase-encoding direction. For frequency encoding in the readout direction, a negative pre-phasing pulse GR- is actuated in the readout direction prior to the acquisition window AQ, and a readout gradient GR is activated during the acquisition window AQ. During the acquisition window AQ, the nuclear resonance signal is sampled, digitized and entered in a row of a raw data matrix in order according to phase factors in known fashion. The procedure is repeated N times with different phase-encoding gradients GP, until the entire k-space is covered. An image is obtained from the filled matrix by means of two-dimensional Fourier transformation. This method need not be explained in more detail, since it is a reconstruction method that is typical in MR imaging in general.

Because of the diffusion gradient GD, the obtained nuclear resonance signal carries information not only about the spatial distribution of the spin density, but also about the diffusion of the spin. The following features are required for the diffusion gradient:

The gradient integral for stationary spin must be zero at the time of the readout of the nuclear resonance signal so that the rephasing condition is satisfied.

There must be a diffusion sensitivity.

In the procedure according to Stejskal/Tanner the first condition is satisfied in that, because of the spin population is inverted by the 180° radio-frequency pulse RF2, and the second sub-pulse GD2 of the diffusion gradient GD acts in opposition to the first sub-pulse GD1 of the diffusion gradient GD with respect to the phase of the nuclear spin. The surfaces of the sub-pulse GD1 and GD2 are the same.

The gradient time integral for stationary spins is thus zero at the time of the readout time of the nuclear resonance signal.

In general terms the rephasing condition at the readout time T of the nuclear resonance signal is as follows:

$$\int_0^T v(T)G(T)dT = 0 \qquad (1)$$

v(T) is defined therein as follows:

v=1 if the nuclear resonance signal in the respective integration interval is an FID (Free Induction Decay) signal, or has experienced an even number of 180° pulses subsequent to excitation. This condition ultimately affirms that the nuclear resonance signal is not inverted.

v=1 if the nuclear resonance signal in the respective integration interval was inverted by the effect of an odd number of 180° pulses subsequent to excitation.

v=0 if the nuclear resonance signal in the respective integration interval is precisely a stimulated echo. Specifically, in this case the k-space filling is not influenced by the gradient.

The abovementioned rephasing condition must apply to all spatial directions, whereby only one phase response for topical coding is impressed on the nuclear resonance signal in the readout interval.

The abovementioned phase dependency applies only to stationary spins. Moving spins (whereby movement in this sense also means diffusion) are subject to a different dependency between the phase response and respective gradients. For diffusion measurement, or diffusion-weighted MR images correspondingly actuated gradients (e.g. according to Stejskal/Tanner) result in diffusion causing attenuation of the MR signal relative to stationary material. The diffusion sensitivity of an MR sequence, which determines this signal attenuation, is given by its diffusion weighting tensor b:

$$b = \begin{pmatrix} b_{xx} & b_{xy} & b_{xz} \\ b_{yx} & b_{yy} & b_{yz} \\ b_{zx} & b_{zy} & b_{zz} \end{pmatrix} \quad (2)$$

The tensor elements therein are defined as follows:

$$b_{ij} = \int_0^T k_i(t)k_j(t)\,dt \quad (4)$$

$$= \int_0^T \left(\int_0^t \gamma v(T)G_i(T)\,dT\right)\left(\int_0^t \gamma v(T)G_j(T)\,dT\right)dt$$

The phase development therein also depends on the quantity V(T) defined above.

As is generally known the material-dependent diffusion is defined in the form of a diffusion tensor D as follows:

$$D = \begin{pmatrix} D_{xx} & D_{xy} & D_{xz} \\ D_{yx} & D_{yy} & D_{yz} \\ D_{zx} & D_{zy} & D_{zz} \end{pmatrix} \quad (4)$$

wherein $D_{ij}$ stands for the mean square run distance/s in each direction.

On the basis of the material-dependent diffusion tensor D and the diffusion weighting tensor b that is dependent on the MR pulse frequency, the signal attenuation due to diffusion in the MR experiment is obtained as follows:

$$e^{-\sum_i \sum_j b_{ij} D_{ij}} \quad (5)$$

By comparing the signal amplitudes obtained with diffusion weighting and without, the diffusion—or more precisely the diffusion tensor D—in the procedure can be determined after a sufficient number of measurements. The diffusion can also be qualitatively determined by the contrast behavior obtained on the basis of the signal attenuation.

A high diffusion sensitivity can be obtained with the described pulse sequence according to Stejskal/Tanner, whereby the abovementioned problems with the imaging admittedly arise. It has been discovered that these problems originate from eddy currents. Eddy currents are induced by actuated gradients in conductive parts of the MR system neighboring the gradient coils. In superconductive magnets eddy currents are induced essentially in the tank and in the cyro-shield of the magnet, for example. In particular, eddy currents with half-lives on the order of magnitude of the duration of the gradient pulses and beyond become disturbingly noticeable in diffusion measurements by virtue of displacing the base components $B_o$ of the magnetic field and by producing magnetic field non-homogeneities. Massive image distortions arise if an echo-planar sequence is used as the readout procedure, for example. Fat saturation pulses also react particularly sensitively to disturbances of the basic magnetic field, since these frequencies have a very narrow bandwidth and are thus particularly sensitive with respect to basic field displacements.

Assuming a linear, time-invariant eddy current behavior H, the local dislocation of the $B_0$ field can be represented by a convolution with the time derivative $\dot{G}$ of the gradient G:

$$\Delta B_o(t) = \int_0^t \gamma \dot{G}(T) H(t-T)\,dT \quad (6)$$

The second term H of the convolution is approximated by a multi-exponential model $$H(t) = \sum h_i e^{-\lambda_i t} \quad (7)$$

wherein $\lambda_i$ represents the different logarithmic decrements of the eddy currents triggered by the gradients. Eddy currents of various strengths with various half-lives are triggered by the gradients.

Eddy currents are thus not visible if the $B_0$ dislocation disappears at the readout time T of the nuclear resonance signal, i.e.

$$\Delta B_X(T) = 0 \quad (8)$$

or if the running phase value used for filling k-space is:

$$\phi(T) = \int_0^T \gamma v(t) \Delta B_O(t)\,dt = 0 \quad (9)$$

Whether equation 8 or 9 dominates depends on the respectively applied pulse sequence in the readout phase of the nuclear resonance signal.

The conditions according to equations 8 and 9 need not be satisfied in the pulse sequence according to Stejskal/Tanner, since the diffusion gradient never changes its sign.

It has been recognized, however, that the conditions according to equation 8 and/or 9—and at the same time the rephasing condition according to equation 1—need to be satisfied if bipolar gradient pulses are used. The eddy currents induced therein by a sub-pulse of the gradient pulse sequence are substantially compensated by a subsequent sub-pulse with inverted polarity.

As a first exemplary embodiment of the invention, FIGS. 5–9 depict a pulse sequence wherein this condition is satisfied. In this case the diffusion gradient GD consists of four sub-pulses GD1 to GD4 of alternating polarity. The pulse sequence begins in typical fashion with a slice-selective 90° radio-frequency pulse RF 1; the first sub-pulse GD1 of the diffusion gradient GD then follows as well as a first 180° radio-frequency pulse RF2, whereby the spins are inverted. A negative sub-pulse GD2 and a positive sub-pulse GD3 of the diffusion gradient GD follow. Finally, the spins are inverted again by another 180° radio-frequency sub-pulse RF 2, and a negative sub-pulse GD4 of the diffusion gradient GD follows. A readout sequence as in the first embodiment according to FIGS. 1–4 follows. It should be emphasized that an arbitrary readout sequence—e.g. even an EP1 sequence—can be used.

The depicted pulse frequency demonstrates about the same sensitivity with respect to the diffusion as does the sequence according to Stejskal/Tanner, but the eddy current behavior is considerably more favorable, since the eddy currents excited by a sub-pulse GD1–GD3 of the diffusion gradient GD are substantially compensated by the subsequent sub-pulse GD2–GD4 of opposite polarity. It is noted in this regard that the 180° radio-frequency pulses RF1 and RF2 do act to invert the nuclear spin, but they have no effect with respect to the eddy currents.

With the sequence according to the FIGS. 5–9 not only can the conditions according to equations 8 and/or 9 be satisfied, but the rephasing condition according to equation 1 can be satisfied as well. With respect to the inverting effect of the radio-frequency pulses RF1 and RF2, the rephasing condition is satisfied if the gradient areas of the sub-gradients GD1 and GD2 are the same as the gradient areas of the sub-gradients GD3 and GD4. A diffusion-weighted pulse sequence with bipolar pulses has already been introduced in the above-referenced article by Feinberg and Jakob. There is no reference therein to the eddy current problem. Furthermore, the sequences described therein have the problem that, due to the refocusing pulses, the previously excited spins not only rephase, but also act again as excitation pulses themselves and cause additional stimulated echos. In dimensioning the length and amplitudes of the sub-pulses GD1–GD4 to satisfy the conditions 1 and 8 and/or 9, one has even more degrees of freedom. These are inventively used to avoid the superimposing the FID signals and stimulated echos on the actually desirable spin echo during the readout window AQ. The gradient pulses GD1–GD4 can be dimensioned such that at echo time T the rephasing condition is satisfied only for the spin echo, but not for an FID signal, or respectively, a stimulated echo. In the first exemplary embodiment this means that the areas, or gradient time integrals of the gradient pulses GD1 to GD4 must not be the same. For example, the first two gradient pulses GD1 and GD2 in the first embodiment have areas of +25%, and –25%, respectively; the third gradient pulse GD3, has an area of 30% ; and the fourth gradient pulse GD4 has an area of –20%. A value of 100% represents the entire surface that is effective or: active for the diffusion weighting. Looking at the FIGS. 5 to 9, it can be seen that the rephasing condition for the spin excited by the first radio-frequency pulse RF1 is thus satisfied in the readout time window AQ, as long as it is a matter of stationary spin. FID signals and stimulated echos caused by the subsequent refocusing pulses RF 2 and RF 3, however, are dephased in the readout time window AQ, since the gradient time integral in the readout direction $G_R$ is not equal to zero for these signals. These signals thus do not contribute to the signals measured in the readout time window AQ, so that image artefacts are avoided. The gradient time integrals of the individual gradient pulses can differ on the basis of different periods or different amplitudes. Since the highest possible gradient amplitude is typically used for diffusion gradients anyway, the period is preferably varied. FIG. 7 depicts a corresponding timing diagram for the pulse sequence, whereby the individual phases last 25 ms, 55 ms, and 20 ms, for example. Assuming short radio-frequency pulses and gradient ramps, the center of the acquisition window (which typically corresponds to the central part of the k-space, which determines contrast) lies at a favorable time, namely 10 ms or 10% of the total duration of the gradient pulse, following the end of the last gradient pulse GD4.

FIG. 14 depicts a typical eddy current behavior for the pulse sequence depicted in FIGS. 5–9. The ratio of the eddy current half-life to the pulse length is shown on the abscissa; the error curve of the eddy current components is shown in % on the ordinate. 100% thereby stands for the error of the last individual pulse. It can be seen that eddy currents with a half-life of 1.414% of the total duration are completely eliminated. Eddy currents with a shorter half-life yield errors with the same sign as the last gradient pulse; longer half-lives reverse the eddy current error. Given long eddy current half-lives the error approaches zero again. The timing can thus be selected such that specifically the central k-space rows that determine contrast remain largely unaffected by eddy currents. Extremely short eddy current half-lives wherein the error becomes particularly large barely interfere in practice anyway, since the measurement does not begin immediately following the last edge of the diffusion-weighted gradient pulses.

The eddy current compensation is further improved with a pulse sequence according to FIGS. 10–13, since a complete compensation for two eddy current half-lives is thus achieved whereby the error for long eddy current half-lives likewise approaches zero again. This pulse sequence likewise starts (FIG. 10) with a 90° radio-frequency pulse RF1, followed in this case by four 180° refocusing pulses RF2 to RF5. All radio-frequency pulses RF1 to RF5 are slice-selective under the influence of slice selection gradient GS according to FIG. 13.The gradient pulses effecting the diffusion sensitivity are distributed as follows:

A positive gradient pulse GD1 between the radio-frequency pulses RF1 and RF2,

A negative gradient pulse GD2 between the radio-frequency pulses RF2 and RF3,

Two gradient pulses GD3 and GD4 of opposing signs— beginning with a positive gradient pulse GD3— between radio-frequency pulses RF3 and RF4, A positive gradient pulse GD5 between the radio-frequency pulses RF4 and RF5, and finally, a negative gradient pulse GD6 between the radio-frequency pulse RF5 and the readout time window AQ.

As usual the nuclear spin is phase-decoded prior to the readout time window AQ by a phase decoding pulse Gp. A readout gradient GR is actuated during the readout time window AQ.

As in the pulse sequences according to the FIGS. 5–9, at the readout time the rephasing condition for stationary spin must be satisfied therein also; i.e., the total gradient time integral must be zero. Furthermore, stimulated echos are dephased here by different gradient time areas of the individual gradient pulses GD1 to GD6.

It should be noted that the invention only relates to the diffusion weighting in a kind of preparation phase; i.e., arbitrary known sequences can be employed for the readout phase—e.g. the previously mentioned EPI sequence. The basis of the invention is to utilize gradient pulses of alternating sign in order to compensate eddy current effects. Due to the 180° pulses lying between the individual gradient pulses, the resulting nuclear resonance signal is read out as a spin echo and the diffusion sensitivity is defined. Stimulated echos are dephased by different gradient time areas of the gradient pulses.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for diffusion detection by magnetic resonance comprising the steps of:

obtaining a spin echo signal in a readout time window by excitation of a nuclear resonance signal with a first radio-frequency pulse and refocusing by at least a second radio-frequency pulse and a third radio-frequency pulse;

activating respective gradient pulses between each of the radio-frequency pulses and prior to the readout window, and alternating the polarity of the respective gradient pulses from gradient pulse-to-gradient pulse; and said gradient pulses in totality having a gradient time integral of zero from a time of said excitation to the readout window the gradient time integrals of at least two of said gradient pulses being different.

2. A method as claimed in claim 1 wherein the step of actuating respective gradient pulses comprises:

activating a gradient pulse of a first polarity between the first radio-frequency pulse and the second radio-frequency pulse;

activating two gradient pulses of differing polarity between the second radio-frequency pulse and the third radio-frequency pulse, beginning with a polarity that is opposite the first polarity;

activating another gradient pulse of the first polarity between the third radio-frequency pulse and the readout window.

3. A method as claimed in claim 1 comprising the additional steps of:

spatially encoding the spin echo signal by activating a phase-encoding gradient prior to the readout time window; and activating a readout gradient during the readout time window.

* * * * *